(12) United States Patent
Rhee

(10) Patent No.: US 6,370,068 B2
(45) Date of Patent: Apr. 9, 2002

(54) SEMICONDUCTOR MEMORY DEVICES AND METHODS FOR SAMPLING DATA THEREFROM BASED ON A RELATIVE POSITION OF A MEMORY CELL ARRAY SECTION CONTAINING THE DATA

(75) Inventor: Sang-Jae Rhee, Seoul (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 09/755,977

(22) Filed: Jan. 5, 2001

(30) Foreign Application Priority Data

Jan. 5, 2000 (KR) .......................................... 2000-319

(51) Int. Cl.[7] ................................................ G11C 7/22
(52) U.S. Cl. ....................... 365/196; 365/194; 365/195; 365/191; 365/190; 365/230.03; 365/51
(58) Field of Search ................................ 365/196, 195, 365/194, 191, 190, 230.03, 51

(56) References Cited

U.S. PATENT DOCUMENTS 5,485,430 A * 1/1996 McClure ..................... 365/233
5,555,210 A * 9/1996 Kato .......................... 365/196
5,901,088 A * 5/1999 Kraus ..................... 365/185.21
5,963,485 A * 10/1999 Brady et al. ........... 365/189.11

* cited by examiner

Primary Examiner—Andrew Q. Tran
(74) Attorney, Agent, or Firm—Myers Bigel Sibley & Sajovec

(57) ABSTRACT

Semiconductor devices and methods of sampling data therefrom are provided in which data is sampled from a memory cell array based on a relative position of a memory cell array section that contains the data. A sense amplifier generates an output signal in response to an address of one or more cells in a memory cell array. A control circuit generates a sample control signal in response to at least a portion of the address (e.g., one or more high order bits of the address) of the one or more cells in the memory cell array. A data sampling circuit then samples the output signal of the sense amplifier in response to the sample control signal. The portion of the memory cell array address used to drive the control circuit may logically divide the memory cell array into two or more sections. The control circuit may adjust the timing of the sample control signal in accordance with the proximity of a memory cell array section to the sense amplifier.

21 Claims, 9 Drawing Sheets

US 6,370,068 B2

1

SEMICONDUCTOR MEMORY DEVICES AND METHODS FOR SAMPLING DATA THEREFROM BASED ON A RELATIVE POSITION OF A MEMORY CELL ARRAY SECTION CONTAINING THE DATA

RELATED APPLICATION

This application claims the benefit of Korean Patent Application No. 2000-319, filed Jan. 5, 2000, the disclosure of which is hereby incorporated herein by reference.

FIELD OF THE INVENTION

The present invention relates generally to semiconductor memory devices and, more particularly, to sampling data contained in semiconductor memory devices.

BACKGROUND OF THE INVENTION

The demand for semiconductor memory devices of increasing integration densities is generally increasing. As a result, the size of memory cell arrays may increase in both the word line and bit line dimensions. One potential problem with the increased size of memory cell arrays is that the speed with which data may be read may be different between those memory cells that are closer to the sense amplifiers and those memory cells that are farther away from the sense amplifiers.

A conventional semiconductor memory device typically includes a set of sense amplifiers that amplify and output data from a memory cell array in response to a sense amplifier enable signal. A set of data sampling circuits may also be included that sample respective pairs of output data from the sense amplifiers and pass the sampled data on to other circuitry for further processing in response to a sampling control signal. Typically, the timing of the sampling control signal is adjusted to allow the data sampling circuits to sample the sense amplifier output data that are associated with memory cells that are farthest away from the sense amplifiers. This is to ensure that the data sampling circuits do not attempt to sample the output data from the sense amplifiers too early before the data from memory cells more distant from the sense amplifiers is available. Thus, even though the speed at which data may be read from memory cells that are relatively far away from the sense amplifiers may be relatively slow, the data may nevertheless be sampled and passed on to other circuitry for further processing.

As the integration of semiconductor memory devices increases, however, the difference in the speed at which data is read from memory cells relatively far away from the sense amplifiers and the speed at which data is read from memory cells relatively close to the sense amplifiers may increase. As a result, conventional techniques for sampling data from a memory cell array may be inadequate.

In the same memory cell array block, the difference in speed at which data may be read may be more than 1 ns between memory cells that are relatively far away from the sense amplifiers and memory cells that are relatively close to the sense amplifiers. If the timing of the sampling control signal is adjusted to allow the data sampling circuits to sample the sense amplifier output data that are associated with memory cells that are farthest away from the sense amplifiers, then data associated with memory cells that are relatively close to the sense amplifiers may not be reliably sampled because the data may not be valid when the sampling control signal triggers the data sampling circuits.

2

For example, FIG. 1 is a schematic that illustrates a conventional semiconductor memory device that comprises memory cell array blocks 10-1, 10-2, ..., and 10-8, multiplexers 12-1, 12-2, ..., and 12-9, sense amplifiers 14-1, ..., 14-4, and data sampling circuits 16-1, ..., 16-4. In FIG.1, multiplexers 12-1, 12-2, ..., and 12-9 are represented as MUX, sense amplifiers 14-1, ..., and 14-4 as SA, and data sampling circuits 16-1, ..., and 16-4 as DS.

In FIG.1, pairs of data input output lines IO11/B, IO12/B, IO13/B, and IO14/B for a memory cell array block 10-1 are arranged on the left and right of the memory cell array block 10-1. Pairs of data input/output line IO21/B, IO22/B, IO23/B, IO24/B, IO31/B, IO32/B, ..., IO71/B, IO72/B, IO81/B, IO82/B, IO83/B, and IO84/B for the respective memory cell array blocks 10-2, ..., and 10-8 are arranged on the left and right of the corresponding memory cell array block. The pairs of data input/output lines IO11/B, IO12/B, IO13/B, IO14/B, IO21/B, IO22/B, IO23/B, IO24/B, IO31/B, IO32/B, ..., IO71/B, IO72/B, IO81/B, IO82/B, IO83/B, IO84/B for the respective memory cell array blocks 10-1, 10-2, ..., and 10-8 are connected to four pairs of main data input output lines MIO1/B, MIO2/B, MIO3/B, MIO4/B. The semiconductor memory device further includes m word select signal lines, which are arranged vertically, for receiving the word select signals WL1, WL2, and WLm, and n column select signal lines, which are arranged horizontally, for receiving the column select signals CSL1, CSL2, ..., and CSLn. The column select signals CSL1, CSL2, ..., and CSLn are electrically coupled to corresponding input/output gates IOG.

Operations of the semiconductor memory device of FIG. 1 are described hereafter. A memory cell may be selected in one of the memory cell array blocks 10-1, 10-2, ..., and 10-8 through activation of one of the word select signals WL1, WL2, ..., and WLm and one of the column select signals CSL1, CSL2, ..., and CSLn for writing data thereto or reading data therefrom. Multiplexers 12-1, 12-2, 12-3, ..., 128, and 12-9 control the input/output of data between the pairs of data input/output lines IO11/B, ..., and IO14/B and the pairs of main data input/output lines MIO1/B, and MIO4/B. For example, if a cell in memory cell array block 10-1 is selected, then multiplexers 12-1 and 12-2 are enabled and data are transmitted between the pairs of data input/output lines IO11/B, ..., and IO14/B and the pairs of main data input/output lines MIO1/B, ..., and MIO4/B. That is, during a write operation, data are input from the pairs of main data input/output lines MIO1/B, ..., and MIO4/B to the pairs of data input/output lines IO11/B, ..., and IO14/B. Conversely, during a read operation, data are transmitted from the pairs of data input/output lines IO11/B, and IO14/B to the pairs of main data input/output lines MIO1/B, ..., and MIO4/B.

Although it is not shown, input and output of data is controlled in response to a read and write control signal and corresponding block select signals, which are applied to the multiplexers 12-1, 12-2, 12-3, ..., 12-8, and 12-9. The sense amplifiers 14-1, ..., and 14-4 amplify a difference in voltage between data signals on the main data input/output lines MIO1/B, ..., and MIO4/B and then output the amplified signals as sense output signal pairs SIO1/B, ..., and SIO4/B. The data sampling circuits 16-1, ..., and 16-4 generate data output signals DO1, ..., and DO4 in response to a sampling control signal FRP.

FIG. 2 illustrates a data sampling circuit of FIG. 1 in more detail. The data sampling circuit 16 comprises NAND gates NA1 and NA2, an inverter 11, a PMOS transistor P, and a NMOS transistor N, which are configured as shown. In FIG.

2, a sense output signal pair is represented as SIO and SIOB, and an output signal of the data sampling circuit 16 is represented as DO.

Operations of the data sampling circuit 16 of FIG. 2 are described hereafter. When the sampling control signal FRP is driven to a "low" logic level, both NAND gates NA1 and NA2 generate a "high" logic signal at output terminals thereof, regardless of the logic levels of the sense output signals SIO and SIOB. An inverter I1 generates an output signal at a "low" logic level. Therefore, both the PMOS transistor P and the NMOS transistor N are turned off.

When the sampling control signal FRP is driven to a "high" logic level and the sense output signals SIO and SIOB are at a "high" logic level and "low" logic level, respectively, the NAND gates NA1 and NA2 generate output signals at a "low" logic level and a "high" logic level, respectively. An inverter I1 generates an output signal at a "low" logic level. Therefore, the PMOS transistor P is turned on, the NMOS transistor N is turned off, and the data output signal DO is driven to a "high" logic level.

On the other hand, when the sampling control signal FRP is driven to a "high" logic level and the sense output signals SIO and SIOB are at a "low" logic level and "high" logic level, respectively, the NAND gates NA1 and NA2 generate output signals at a "high" logic level and a "low" logic level, respectively. An inverter I1 generates an output signal at a "high" logic level. Therefore, the PMOS transistor P is turned off, the NMOS transistor N is turned on, and the data output signal DO is driven to a "low" logic level.

FIGS. 3A and 3B are signal timing diagrams for the semiconductor device of FIG. 1. FIG. 3A illustrates an example in which a column address is decoded that results in the generation of column select signal CSL1. Similarly, FIG. 3B illustrates an example in which a column address is decoded that results in the generation of column select signal CSLn. The column address strobe latency is two cycles. That is, data is output from the semiconductor memory device two cycles after a column address strobe signal CAS has been input. The striped sections of FIGS. 3A and 3B indicate that the data is invalid during those periods.

In the first, second, and third cycles I, II, and III shown in FIGS. 3A and 3B, if an inverted write enable signal WEB at a "high" logic level is applied in a rising transition of a clock signal, then a read operation is performed. When a column address is input, the column select signal CSL1 is generated. A sense amplifier enable signal SAEN transitions to a "high" logic level in response to the "high" logic level of the inverted write enable signal WEB.

In the second and third cycles II and III of FIGS. 3A and 3B, sense amplifiers 14-1, . . . , and 14-4 amplify data, which are output from pairs of main data input/output lines MIO1/B, . . . , and MIO4/B, in response to a sense amplifier enable signal SAEN. The amplified data are then output as pairs of sense output signals SIO/B. Data sampling circuits 16-1, . . . , and 16-4 sample the pair of sense output signals SIO/B in response to a sampling control signal FRP to generate the data output signal DO.

As shown in FIGS. 3A and 3B with respect to the sense output signal pair SIO/B, data read from memory cells connected to the column select signal CSL1 are generated later than data read from memory cells connected to the column select signal CSLn. Furthermore, the sampling control signal FRP is driven to a "high" logic level at time t1, which corresponds to the time that the sense output signal pair SIO/B has valid data from the memory cells that are connected to the column select signal CSL1.

As the size of memory cell arrays increases, time t1 may be delayed even further, which may result in the loss of read data. Specifically, the enable period T1 for the sampling control signal FRP begins at time t1 and ends at time t2, which corresponds to the point in time at which the sense output signal pair SIO/B no longer has valid data from the memory cells that are connected to the column select signal CSLn. As time t1 approaches time t2, the enable period T1 (i.e., the period of time when there is valid data at the output of the sense amplifiers for data cells that are connected to the column select signal CSL1 and data cells that are connected to the column select signal CSLn) for the sampling control signal FRP shrinks. If the enable period T1 becomes too small or is eliminated entirely, then loss of read data may result.

Thus, an enable period of a sampling control signal of a conventional semiconductor memory device is generally limited as follows: The enable period of the sampling control signal begins when data read from memory cells that are relatively far from the sense amplifiers are provided at the output terminals of the sense amplifiers, and the enable period of the sampling control signal ends when data read from memory cells that are relatively close to the sense amplifiers are no longer valid at the output terminals of the sense amplifiers.

Unfortunately, during high frequency operation, read data from a memory cell array may be lost due to a short or potentially non-existent enable period for the sampling control signal. Consequently, there exists a need for improved semiconductor memory devices and methods for sampling data therefrom.

SUMMARY OF THE INVENTION

Embodiments of the present invention include semiconductor devices and methods of sampling data therefrom in which data is sampled from a memory cell array based on a relative position of a memory cell array section that contains the data. For example, a sense amplifier generates an output signal in response to an address of one or more cells in a memory cell array. A control circuit generates a sample control signal in response to at least a portion of the address (e.g., one or more high order bits of the address) of the one or more cells in the memory cell array. A data sampling circuit then samples the output signal of the sense amplifier in response to the sample control signal. The portion of the memory cell array address used to drive the control circuit may logically divide the memory cell array into two or more sections. The control circuit may adjust the timing of the sample control signal in accordance with the proximity of a memory cell array section to the sense amplifier. Advantageously, the present invention may be used to provide improved data sampling in memory cell arrays that may have non-negligible delays between the time that data are provided at the output of sense amplifiers from memory cell array sections that are closer to the sense amplifiers and the time that data are provided at the output of sense amplifiers from memory cell array sections that are further away from the sense amplifiers.

The address of the one or more cells in the memory cell array may be a column address, row address, or a combination of both a column address and a row address. Embodiments of the control circuit include a delay circuit, which generates a delayed control signal in response to a control signal, and logic circuitry, which generates the sample control signal in response to the control signal, delayed control signal, and the portion of the address of the one or more cells in the memory cell array. For example, if the portion of the address indicates that the one or more memory cell array cells are located in a section of the memory cell array that is relatively distant from the sense amplifier, then the logic circuitry may generate the sample control signal as the delayed control signal. If, however, the portion of the address indicates that the one or more memory cell array cells are located in a section of the memory cell that is relatively close to the sense amplifier, then the logic circuitry may generate the sample control signal as the control signal.

The control circuit may generate the sample control signal such that it is delayed relative to the control signal based on the proximity of the memory cell array section identified by the portion of the address of the one or more cells in the memory cell array. As a result, improved data sampling may be provided.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
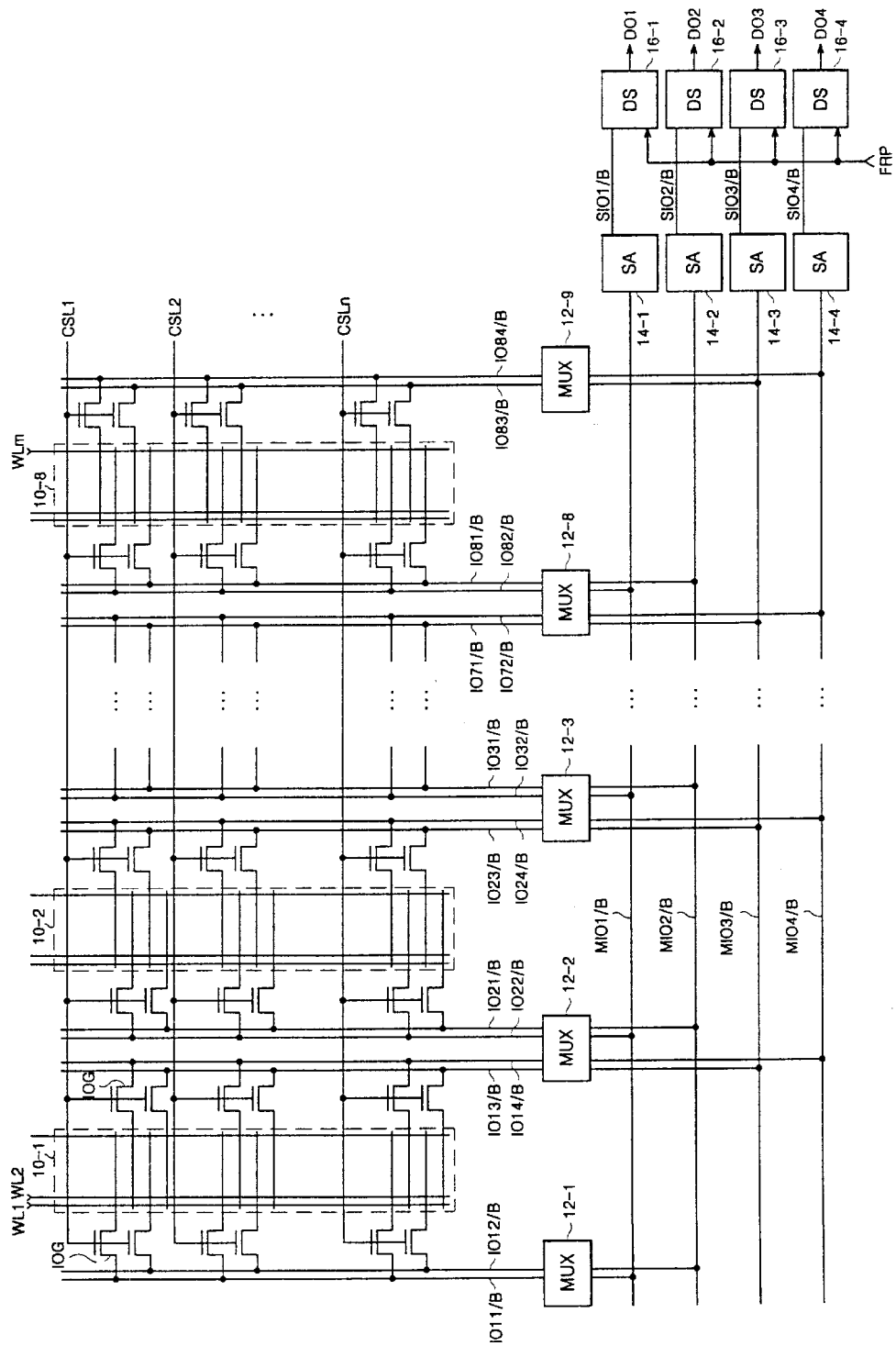
FIG. 1 is a schematic that illustrates a conventional semiconductor memory device.
Figure 2:
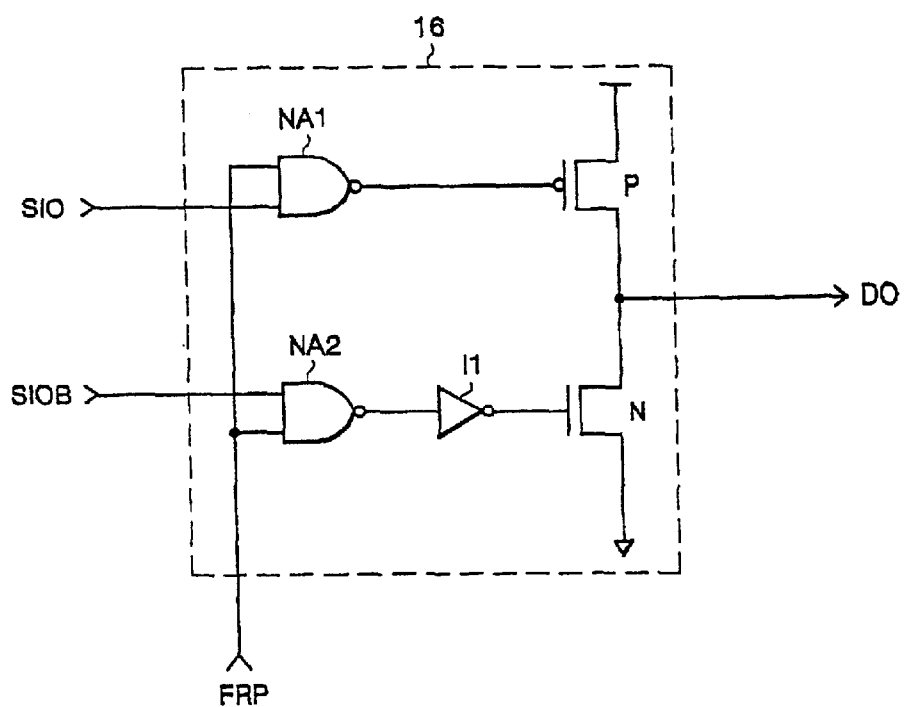
FIG. 2 illustrates a data sampling circuit of FIG. 1.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

Figure 4:
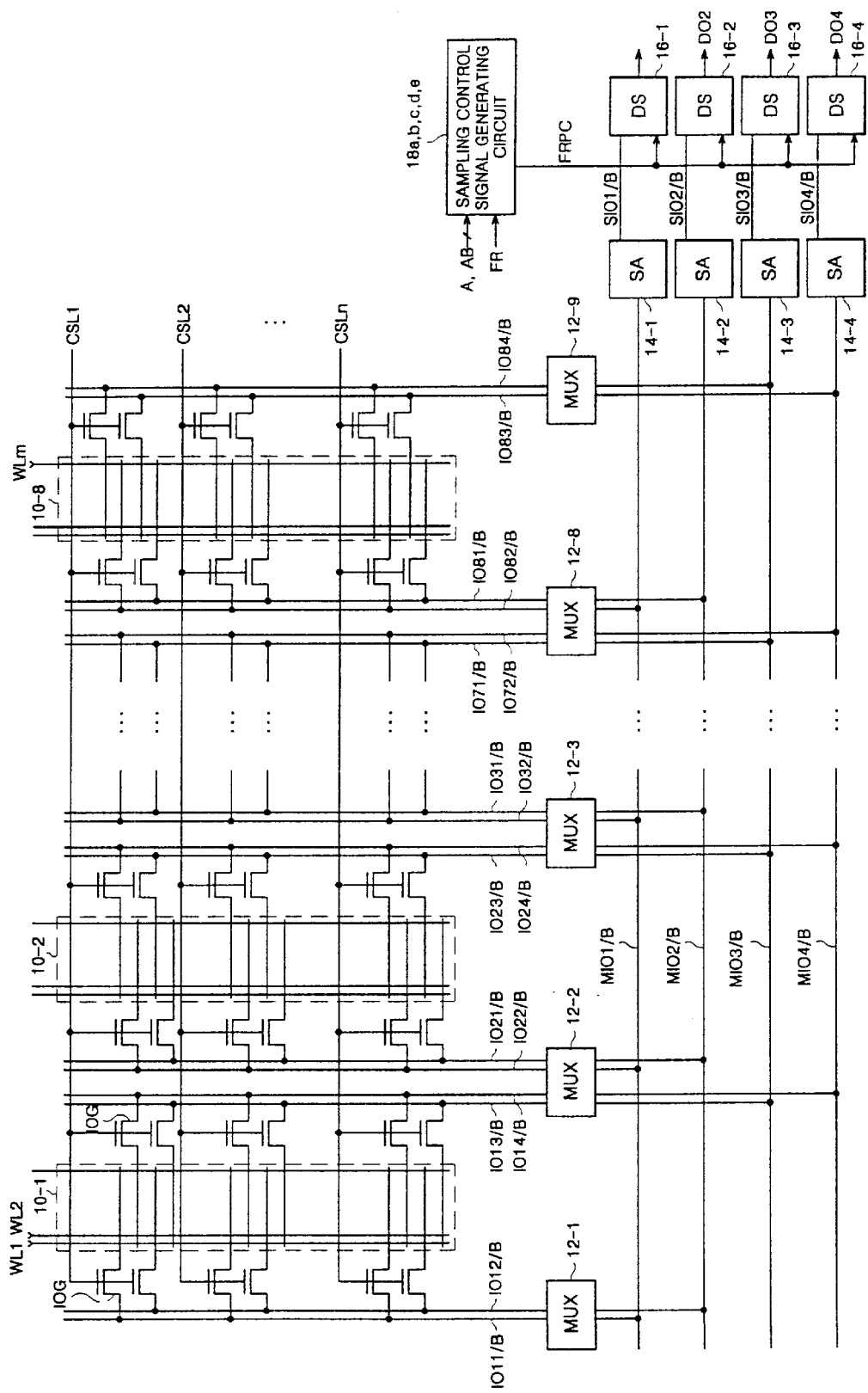
FIG. 4 is a schematic that illustrates an semiconductor memory device having a sampling control signal generating circuit in accordance with embodiments of the present invention.

FIG. 4 is a schematic that illustrates an semiconductor memory device having a sampling control signal generating circuit 18*a,b,c,d,c* in accordance with embodiments of the present invention. The sampling control signal generating circuit 18*a,b,c,d,e* generates a sampling control signal FRPC based on a relative position of the memory cell array section that contains the data to be read and that may be identified by the signals A and AB. The signals A and AB may comprise at least a portion of a memory cell array address, such as one or more of the high order bits of the memory cell array address. The timing of a control signal FR is preferably adjusted to allow the data sampling circuits to sample the sense amplifier output data that are associated with memory cells that are closest to the sense amplifiers 14-1, . . . , 14-4 (i.e., memory cells that are connected to the column address signal CSLn). Advantageously, the enabling period of the control signal FR and the sampling control signal FRPC may be extended so as to include a period when the sense output signal pairs SIO/B include valid data.

In applications in which the semiconductor memory device is operated at high frequency, such as when data are read from portions of the memory cell array that correspond to both signals A and AB, the sampling control signal FRPC may also be generated at a high frequency. Conversely, when the semiconductor memory device is operated at a lower frequency, the sampling control signal FRPC may be generated at a lower frequency. In accordance with embodiments of the present invention, the sampling control signal FRPC is not generated at a fixed point in time. Instead, the sampling control signal generating circuit 18*a,b,c,d,e* generates the sampling control signal FRPC based on a relative position of the memory cell array section that contains the data to be read.

Figure 5:
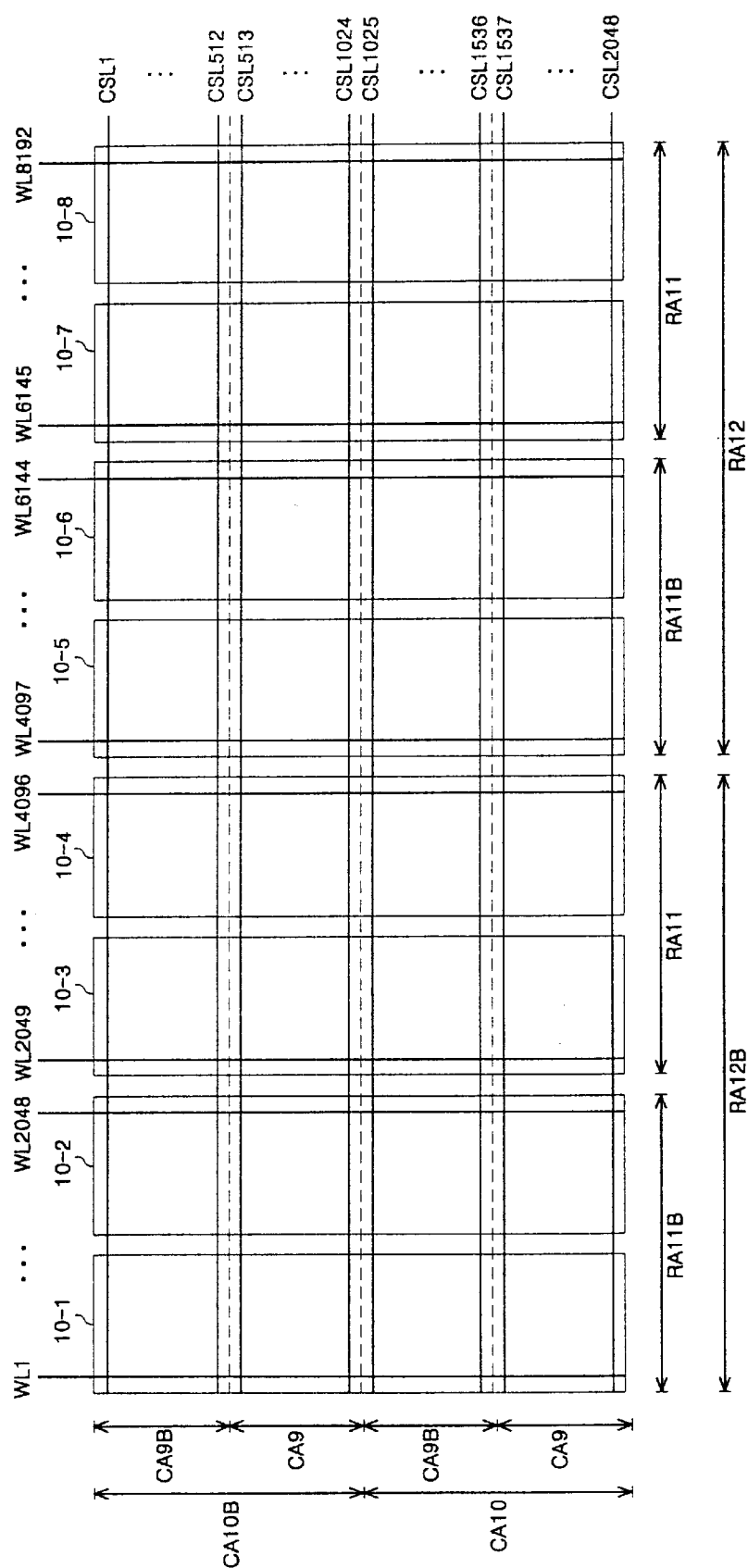
FIG. 5 is a schematic that illustrates memory cell array block sections of the memory cell array of FIG. 4 in accordance with embodiments of the present invention.

FIG. 5 is a schematic that illustrates memory cell array block sections of the memory cell array of FIG. 4, in accordance with embodiments of the present invention. The memory cell array includes eight memory cell array blocks 10-1, 10-2, . . . , and 10-8 and has 8K memory cells in a horizontal direction and 2K memory cells in a vertical direction. As shown in FIG. 5, 8192 word select signals WL1–WL8192 are generated by 13 bits of a row address RA12–RA0, and 2048 column select signals CSL1–CSL2048 are generated by 11 bits of a column address CA10–CA0.

Operations for accessing the semiconductor memory device of FIG. 5 will be described hereafter. Column select signals CSL1, . . . , and CSL1024 are selected when an inverted column address bit CA10B is at a "high" logic level, and column select signals CSL1025, . . . , and CSL2048 are selected when a column address bit CA10 is at a "high" logic level. Column select signals CSL1 . . . , and CSL512 are selected when inverted column address bits CA10B and CA9B are at "high" logic levels, and column select signals CSL513, . . . , and CSL1024 are selected when an inverted column address bit CA10B and a column address bit CA9 are at "high" logic levels. Column select signals CSL1025, . . . , and CSL1536 are selected when a column address bit CA9B and an inverted column address bit CA9B are at "high" logic levels, and column select signals CSL1537, . . . , and CSL2048 are selected when column address bits CA10 and CA9 are at "high" logic levels.

Likewise, word lines WL1, . . . , and WL4096 arc selected when an inverted row address bit RA12B is at a "high" logic level, and word lines WL4097, . . . , and WL8192 are selected when a row address bit RA12 is at a "high" logic level. Word lines WL1, . . . , and WL2048 are selected when inverted row address bits RA12B and RA11B are at "high" logic levels, and word lines WL2049, . . . , and WL4096 are selected when an inverted row address bit RA12B and a row address bit RA11 are at "high" logic levels. Word lines WL4097, . . . , and WL6144 are selected when a row address bit RA12 and an inverted row address bit RA11B are at "high" logic levels, and word lines WL6145, . . . , and WL8192 are selected when row address bits RA12 and RA11 are at "high" logic levels.

As shown in FIG. 5, a memory cell array of an semiconductor memory device, according to embodiments of the present invention, may be divided into sections based on at least a portion of a column and/or a row address. The sampling control signal generating circuit 18a,b,c,d,e generates the sampling control signal FRPC at a point of time when data that are read from a particular section of the memory cell array are generated as sense output signal pairs.

The sampling control signal generation circuit 18a,b,c,d,e may generate the sampling control signal FRPC at different points in time based on which section of the memory cell array data is being read from. Nevertheless, it is preferable that the timing of the sampling control signal FRPC for a particular section of the memory cell array be adjusted to allow the data sampling circuits to sample the sense amplifier output data that are associated with memory cells within that particular section that are farthest away from the sense amplifiers.

Figure 6:
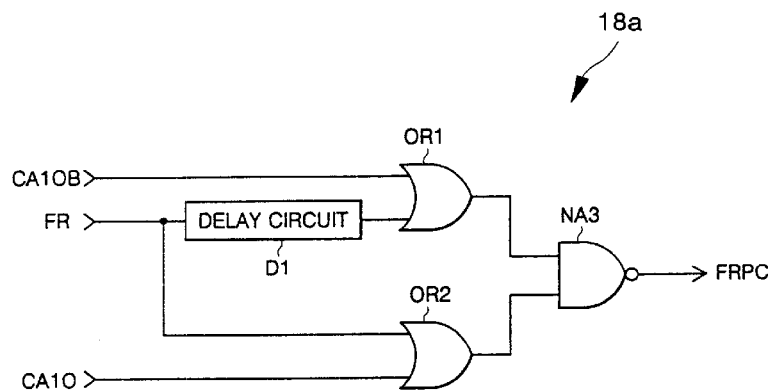
FIGS. 6–10 illustrate the sampling control signal generating circuit of FIG. 4 in accordance with various embodiments of the present invention.

FIG. 6 is a schematic that illustrates the sampling control signal generating circuit 18a,b,c,d,c in accordance with embodiments of the present invention. As shown in FIG. 6, the sampling control signal generating circuit 18a comprises a delay circuit D1, OR gates OR1, OR2, and a NAND gate NA3, which are configured as shown.

Exemplary operations of the sampling control signal generating circuit 18a of FIG. 6, in accordance with embodiments of the present invention, will be described hereafter. The delay circuit D1 generates an output signal by delaying the control signal FR. OR gate OR1 generates an output signal that corresponds to the output of the delay circuit D1 when an inverted column address bit CA10B is at a "high" logic level. OR gate OR2 generates an output signal that corresponds to the control signal FR when a column address bit CA10 is at a "high" logic level. A NAND gate NA3 generates the sampling control signal FRPC by performing a NAND operation on the output signals of the OR gates OR1 and OR2.

The sampling control signal generating circuit 18a shown in FIG. 6 delays the control signal FR for a predetermined time and generates the sampling control signal FRPC as the delayed control signal when an inverted column address bit CA10B is at a "high" logic level. If the column address bit CA10 is at a "high" logic level, then the sampling control signal generating circuit 18a generates the sampling control signal FRPC as the control signal FR.

The timing of the control signal FR is preferably adjusted to allow the data sampling circuits to sample the sense amplifier output data that are associated with sections of the memory cell array memory cells that are relatively close to the sense amplifiers. Furthermore, it is preferable that the timing of the sampling control signal FRPC for a particular section of the memory cell array be adjusted to allow the data sampling circuits to sample the sense amplifier output data that are associated with memory cells within that particular section that are relatively far away from the sense amplifiers.

The sampling control signal generating circuit 18a shown in FIG. 6 generates the sampling control signal FRPC by delaying a control signal FR for a predetermined time when any of the column select signals CSL1, . . . , and CSL1024 are selected. And, when any of the column select signals CSL1025, . . . , and CSL2048 are selected, the sampling control signal generating circuit 18a generates the sampling control signal FRPC as the control signal FR. That is, the sampling control signal generating circuit 18a shown in FIG. 6 horizontally divides the memory cell array into two sections and generates the sampling control signal FRPC at a point in time based on which section the data to be read resides in.

Figure 7:
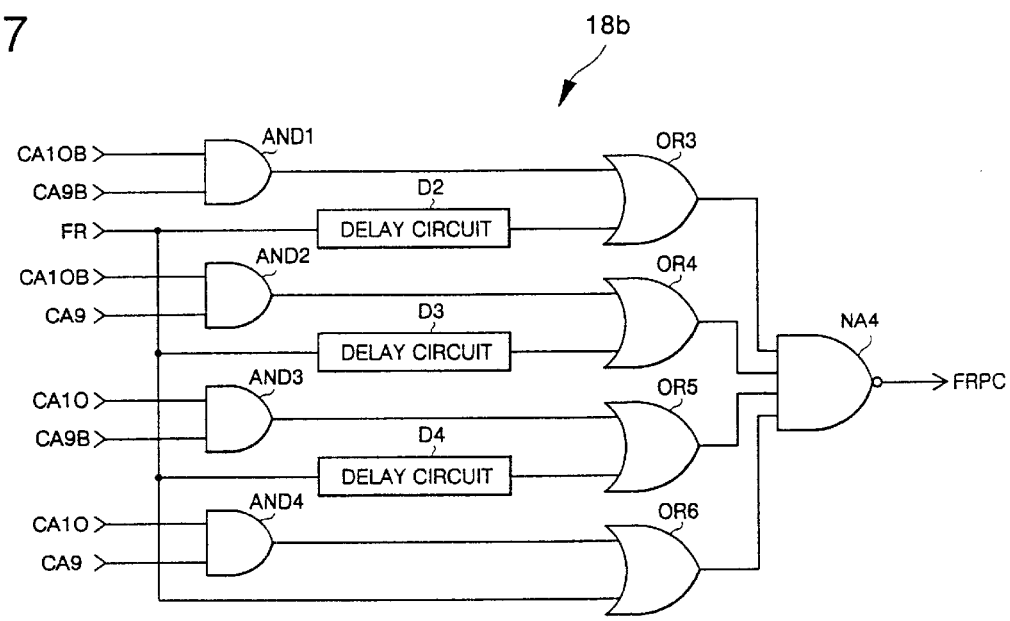

FIG. 7 is a schematic that illustrates the sampling control signal generating circuit 18a,b,c,d,e in accordance with further embodiments of the present invention.

As shown in FIG. 7, the sampling control signal generating circuit 18b comprises AND gates AND1, AND2, AND3, and AND4, delay circuits D2, D3, and D4, OR gates OR3, OR4, OR5, and OR6, and a NAND gate NA4, which are configured as shown. Preferably, the delay applied by the delay circuit D2 is longer than the delay applied by the delay circuit D3, and the delay applied by the delay circuit D3 is longer than the delay applied by the delay circuit D4.

Exemplary operations of the sampling control signal generating circuit 18b of FIG. 7, in accordance with embodiments of the present invention, will be described hereafter. AND gate AND1 generates an output signal at a "high" logic level when the inverted column address bits CA10B and CA9B are at "high" logic levels. AND gate AND2 generates an output signal at a "high" logic level when the inverted column address bit CA10B and the column address bit CA9 are at "high" logic levels. AND gate AND3 generates an output signal at a "high" logic level when the inverted column address bit CA9B and the column address bit CA10 are at "high" logic levels. AND gate AND4 generates an output signal at a "high" logic level when column address bits CA10 and CA9 are at "high" logic levels.

Delay circuits D2, D3, and D4 generate output signals by delaying the control signal FR for predetermined times, respectively. As described above, the delay time of the delay circuit D2 is preferably longer than that of the delay circuit D3, and the delay time of the delay circuit D3 is preferably longer than that of the delay circuit D4. OR gate OR3 generates an output signal that corresponds to the output of the delay circuit D2 when the output signal of the AND gate AND1 is at a "high" logic level. Similarly, the OR gates OR4, OR5, and OR6 generate respective output signals that correspond to the output signals of delay circuits D3, D4, and the control signal FR, respectively, when the output signals of the AND gates AND2, AND3 and AND4 are at "high" logic levels, respectively. NAND gate NA4 generates the sampling control signal FRPC by performing a NAND operation on the output signals of the OR gates OR3, OR4, OR5, and OR6.

The sampling control signal generating circuit 18b shown in FIG. 7 delays the control signal FR using the delay circuit D2 when the inverted column address bits CA10B and CA9B are at "high" logic levels, and delays the control signal FR using the delay circuit D3 when the inverted column address bit CA10B and the column address bit CA9 are at "high" logic levels, and delays the control signal FR using the delay circuit D4 when the inverted column address bit CA9B and the column address bit CA10 are at "high" logic levels. The sampling control signal FRPC is generated as the output signal of one of the delay circuits D2, D3 and D4 when the output signal of one of the AND gates AND1, AND2, and AND3 is at a "high" logic level. And, when column address bits CA10 and CA9 are at "high" logic levels, the sampling control signal FRPC is generated as the control signal FR.

In other words, the delay circuit D2 delays the control signal FR and the sampling control signal FRPC is generated as the output of the delay circuit D2 when any of column select signals CSL1, . . . , and CSL512 (see, FIG. 5) are selected. The delay circuit D3 delays the control signal FR and the sampling control signal FRPC is generated as the output of the delay circuit D3 when any of column select signals CSL513, . . . , and CSL1024 are selected. And the delay circuit D4 delays the control signal FR and the sampling control signal FRPC is generated as the output of the delay circuit D4 when any of column select signals CSL1025, . . . , and CSL1536 are selected. The sampling control signal FRPC is generated as the control signal FR when any of the column select signals CSL1537, . . . , and CSL2048 are selected. The control signal FR is generated in the same manner as discussed above with reference to FIG. 6.

The sampling control signal generating circuit 18b shown in FIG. 7 horizontally divides the memory cell array into four sections and generates the sampling control signal FRPC at a point in time based on which section the data to be read resides in. More specifically, the sampling control signal generating circuits of FIGS. 6 and 7 divide the memory cell array into a predetermined number of sections that may be selected or identified using a predetermined number of bits of a column address. The sampling control signal FRPC is generated at a point in time based on when the data that are associated with memory cells within a particular section are available and valid as sense output signal pairs.

Figure 8:
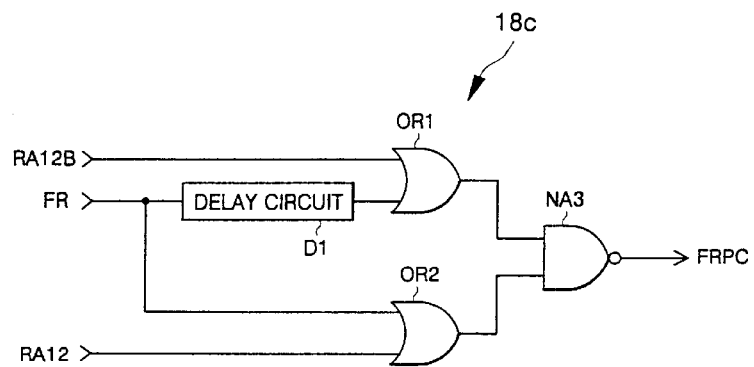

FIG. 8 is a schematic that illustrates the sampling control signal generating circuit 18a,b,c,d,e in accordance with further embodiments of the present invention. The circuit structure of FIG. 8 is identical to that of FIG. 6. The difference between the sampling control signal generating circuit embodiments of FIG. 8 and FIG. 6 is that the circuit is responsive to a portion of a row address in FIG. 8 and the circuit is responsive to a portion of a column address in FIG. 6. With reference to FIG. 8, the OR gate OR1 is responsive to row address bit RA12B and the OR gate OR2 is responsive to the row address bit RA12.

Likewise, exemplary operations of the sampling control signal generating circuit 18c of FIG. 8 are similar to the operations discussed hereinabove with reference to FIG. 6. The sampling control signal generating circuit 18c shown in FIG. 8 delays the control signal FR for a predetermined time and generates the sampling control signal FRPC as the delayed control signal when an inverted row address bit RA12B is at a "high" logic level. If the row address bit RA12 is at a "high" logic level, then the sampling control signal generating circuit 18c generates the sampling control signal FRPC as the control signal FR.

The sampling control signal generating circuit 18c shown in FIG. 8 generates the sampling control signal FRPC by delaying a control signal FR for a predetermined time when any of the word select signals WL1, . . . , and WL4096 are selected. And, when any of the word select signals WL4097, . . . , and WL8192 are selected, the sampling control signal generating circuit 18c generates the sampling control signal FRPC as the control signal FR.

Figure 9:
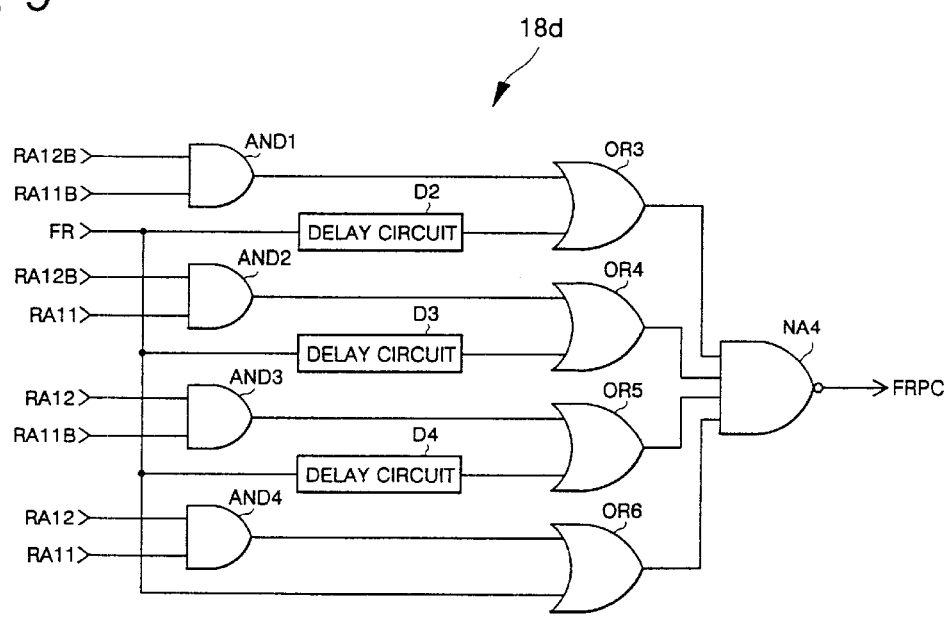

FIG. 9 is a schematic that illustrates the sampling control signal generating circuit 18a,b,c,d,e in accordance with further embodiments of the present invention. The circuit structure of FIG. 9 is identical to that of FIG. 7. The difference between the sampling control signal generating circuit embodiments of FIG. 9 and FIG. 7 is that the circuit is responsive to a portion of a row address in FIG. 9 and the circuit is responsive to a portion of a column address in FIG. 7. With reference to FIG. 9, the AND gate AND1 is responsive to row address bits RA12B and RA11B, the AND gate AND2 is responsive to row address bits RA12B and RA11, the AND gate AND3 is responsive to the row address bits RA12 and RA11B, and the AND gate AND4 is responsive to the row address bits RA12 and RA11.

Likewise, exemplary operations of the sampling control signal generating circuit 18d of FIG. 9 are similar to the operations discussed hereinabove with reference to FIG. 7. AND gate AND1 generates an output signal at a "high" logic level when the inverted row address bits RA12B and RA11B are at "high" logic levels. AND gate AND2 generates an output signal at a "high" logic level when the inverted row address bit RA12B and the row address bit RA11 are at "high" logic levels. AND gate AND3 generates an output signal at a "high" logic level when the inverted row address bit RA11B and the row address bit RA12 are at "high" logic levels. AND gate AND4 generates an output signal at a "high" logic level when row address bits RA12 and RA11 are at "high" logic levels.

OR gate OR3 generates an output signal that corresponds to the output of the delay circuit D2 when the output signal of the AND gate AND1 is at a "high" logic level. Similarly, the OR gates OR4, OR5, and OR6 generate respective output signals that correspond to the output signals of delay circuits D3, D4, and the control signal FR, respectively, when the output signals of the AND gates AND2, AND3 and AND4 are at "high" logic levels, respectively. NAND gate NA4 generates the sampling control signal FRPC by performing a NAND operation on the output signals of the OR gates OR3, OR4, OR5, and OR6.

In other words, the delay circuit D2 delays the control signal FR and the sampling control signal FRPC is generated as the output of the delay circuit D2 when any of the word select signals WL1, . . . , and WL2048 are selected. The delay circuit D3 delays the control signal FR and the sampling control signal FRPC is generated as the output of the delay circuit D3 when any of word select signals WL2049, . . . , and WL4096 are selected. And the delay circuit D4 delays the control signal FR and the sampling control signal FRPC is generated as the output of the delay circuit D4 when any of word select signals WL4097, . . . , and WL6144 are selected. The sampling control signal FRPC is generated as the control signal FR when any of the word select signals WL6145, . . . , and WL8192 are selected.

The embodiments of the sampling control signal generating circuit shown in FIGS. 8 and 9 generate the sampling control signal FRPC at different points in time based on the row address of the section that the data to be read resides in because the length between pairs of data input/output lines and pairs of main data input/output lines is different not only in a direction between column select signal lines, but also in a direction between word select signal lines.

The sampling control signal generating circuit embodiments shown in FIGS. 8 and 9 vertically divide the memory cell array into a predetermined number of sections that may be selected or identified using a predetermined number of bits of a row address. The sampling control signal FRPC is generated at a point in time based on when the data that are associated with memory cells within a particular section are available and valid as sense output signal pairs.

Figure 10:
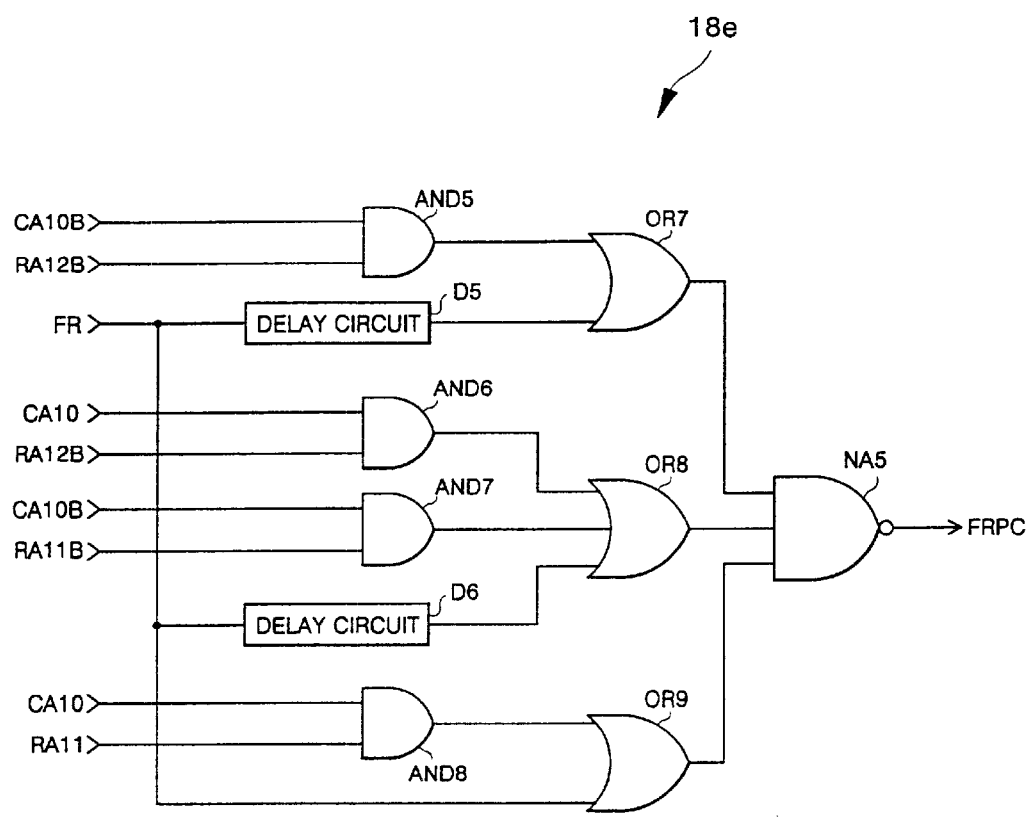

FIG. 10 is a schematic that illustrates the sampling control signal generating circuit 18a,b,c,d,e in accordance with further embodiments of the present invention. As shown in FIG. 10, the sampling control signal generating circuit 18e comprises AND gates AND5, AND6, AND7, and AND8, delay circuits D5 and D6, OR gates OR7, OR8, and OR9, and a NAND gate NA5, which are configured as shown.

The sampling control signal generating unit 18e shown in FIG. 10 generates the sampling control signal FRPC at a time based on whether one of column select signals CSL1, . . . , and CSL1024 and one of word select signals WL1 . . . , and WL4096 are selected, whether one of column select signals CSL1025 . . . , and CSL2048 and one of word select signals WL4097 . . . , and WL8192 are selected, whether one of column select signals CSL1 . . . , and CSL1024 and one of word select signals WL4097 and WL8192 are selected, and whether one of column select signals CSL1025 . . . , and CSL2048 and one of word select signals WL4097 . . . , and WL8192 are selected.

It will be understood that, in accordance with embodiments of the present invention, the delay applied to the control signal FR in each of the four cases described in the foregoing may be different. Nevertheless, according to the embodiment of the sampling control signal generating unit 18e shown in FIG. 10, a same delay is applied to the control signal FR when one of column select signals CSL1 . . . , and CSL1024 and one of word select signals WL4097 . . . , and WL8192 are selected, as is applied when one of column select signals CSL1025 . . . , and CSL2048 and one of word select signals WL1 . . . , and WL4096 are selected.

Exemplary operations of the sampling control signal generating circuit 18c of FIG. 10 in accordance with embodiments of the present invention will be described hereafter. AND gate AND5 generates an output signal at a "high" logic level when the inverted column address bit CA10B and the inverted row address bit RA12B are at "high" logic levels. AND gate AND6 generates an output signal at a "high" logic level when the column address bit CA10 and the inverted row address bit RA12B are at "high" logic levels. AND gate AND7 generates an output signal at a "high" logic level when the inverted column address bit CA10B and the inverted row address bit RA11B are at "high" logic levels. AND gate AND8 generates an output signal at a "high" logic level when column address bit CA10 and row address bit RA11 are at "high" logic levels.

Delay circuits D5 and D6 generate output signals by delaying the control signal FR for predetermined times, respectively. The delay time of the delay circuit D5 is preferably longer than that of the delay circuit D6. OR gate OR7 generates an output signal that corresponds to the output of the delay circuit D5 when the output signal of the AND gate AND5 is at a "high" logic level. OR gate OR8 generates an output signal that corresponds to the output of the delay circuit D6 when the output signal of the AND gate AND6 or the output signal of the AND gate AND7 is at a "high" logic level. OR gate OR9 generates an output signal that corresponds to the control signal FR when the output signal of the AND gate AND8 is at a "high" logic level. NAND gate NA4 generates the sampling control signal FRPC by performing a NAND operation on the output signals of the OR gates OR7, OR8, and OR9.

The sampling control signal generating circuit 18e shown in FIG. 10 divides the memory cell array into four sections: two sections in a vertical direction and two sections in a horizontal direction. The sampling control signal FRPC is generated at a point in time based on when the data that are associated with memory cells within a particular section are available and valid as sense output signal pairs.

Figure 3A:
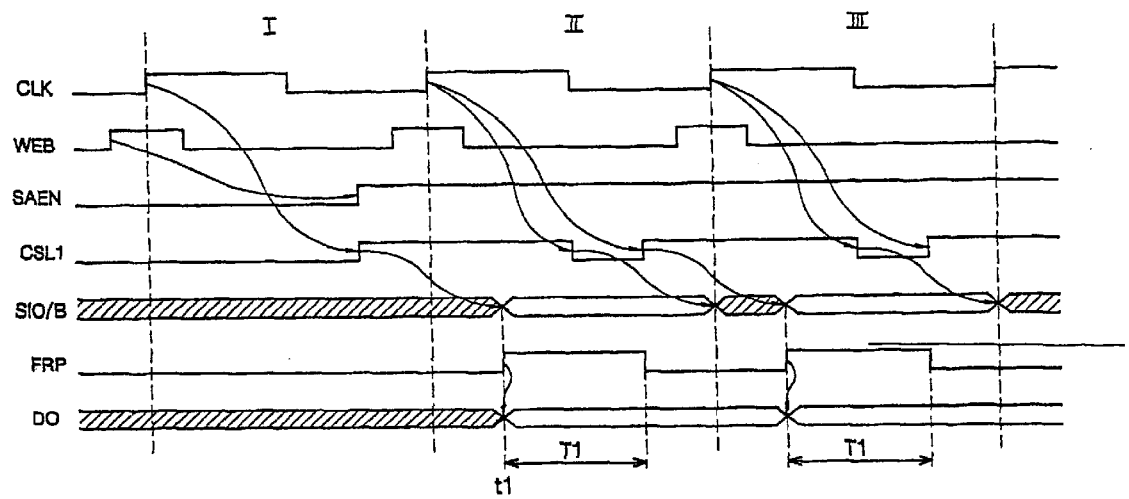
FIGS. 3A and 3B are signal timing diagrams for the semiconductor memory device of FIG. 1.
Figure 3B:
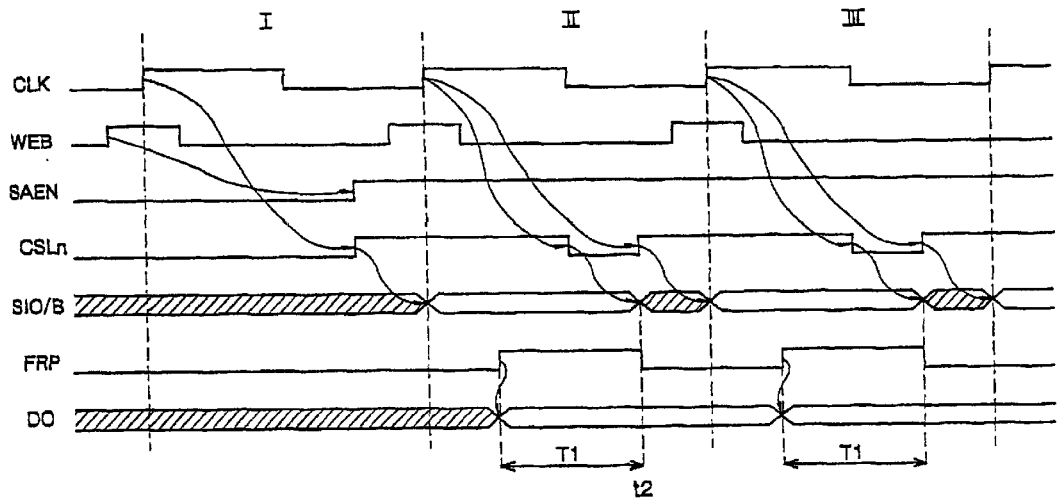
Figure 11A:
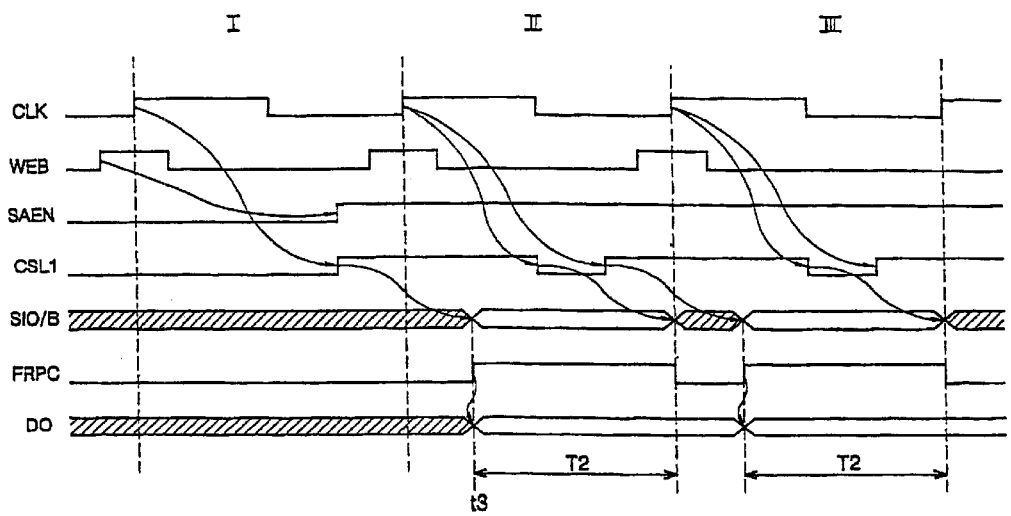
FIGS. 11A and 11B are signal timing diagrams for the semiconductor memory device of FIG. 4 in accordance with embodiments of the present invention.
Figure 11B:
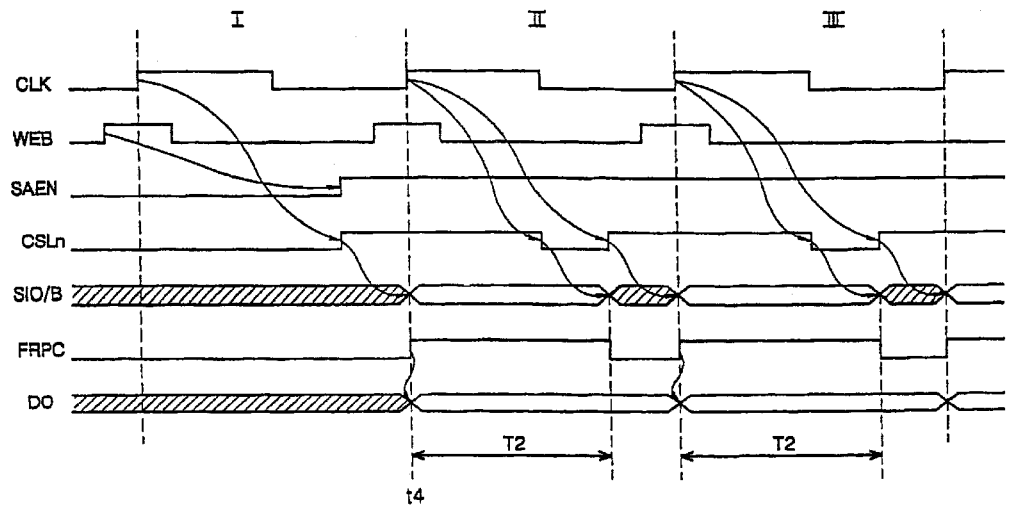

FIGS. 11A and 11B are signal timing diagrams that illustrate operations of the semiconductor memory device embodiments of FIGS. 5–10 in accordance with the present invention. Specifically, FIGS. 11A and 11B illustrate operations of semiconductor memory devices according to embodiments of the present invention in which a clock signal CLK, an inverted write enable signal WEB, a sense amplifier enable signal SAEN, and column address signals CSL1 and CSLn are generated in the same manner as shown in FIGS. 3A and 3B. The striped sections of FIGS. 11A and 11B indicate that the data is invalid during those periods.

In the second and third cycles II and III of FIG. 11A, a sampling control signal FRPC is enabled for a valid period T2 when sense out signal pairs SIO/B are generated. That is, a sampling control signal FRPC is enabled at a time t3 when sense output signal pairs SIO/B first have valid data and data output signal DO is output.

In the second and third cycles II and III of FIG. 11B, a sampling control signal FRPC is enabled for a valid period T2 when sense output signal pairs SIO/B are generated. That is, a sampling control signal FRPC is enabled at a time t4 when sense out signal pairs SIO/B first have valid data and data output signal DO is output.

As shown in FIGS. 11A and 11B, a sampling control signal FRPC is generated at a point in time based on when the sense output signal pairs SIO/B first have valid data. Moreover, the enable period of a sampling control signal FRPC corresponds to period T2 while the sense output signal pairs SIO/B have valid data.

Recall from the discussion with respect to FIGS. 3A and 3B that the sampling control signal FRP is generated at a fixed point in time t1, which corresponds to the time that the sense output signal pair SIO/B has valid data from the memory cells that are connected to the column select signal CSL1. The enable period T1 ends at a time t2, which corresponds to the point in time at which the sense output signal pair SIO/B no longer has valid data from the memory cells that are connected to the column select signal CSLn. Thus, the enable period T1 is limited in conventional semiconductor memory devices as discussed hereinabove. Advantageously, in accordance with the present invention, the enable period T2 for the sampling control signal FRPC need not be limited because the times t3 and t4 can be changed based on the relative position of the memory cell array section that contains the data to be read so as to extend the period T2 to encompass the interval when sense output signal pairs SIO/B have valid data.

From the foregoing, it can readily be seen that semiconductor memory devices and methods for sampling data therefrom, in accordance with the present invention, may reduce the loss of data during read operations by dividing the memory cell array into sections and then generating the sampling control signal at a point in time that is based on which section the data to be read resides in. Moreover, loss of read data may also be reduced during high frequency operation because an enable period of the sampling control signal can be extended.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

I claim:

1. A semiconductor memory device, comprising:

a memory cell array;

a sense amplifier electrically coupled to the memory cell array;

a control circuit that generates a sample control signal in response to at least a portion of an address of at least one cell in the memory cell array; and a data sampling circuit that samples an output of the sense amplifier in response to the sample control signal.

2. A semiconductor memory device as recited in claim 1, wherein the address of the at least one cell in the memory cell array comprises a column address.

3. A semiconductor memory device as recited in claim 1, wherein the address of the at least one cell in the memory cell array comprises a row address.

4. A semiconductor memory device as recited in claim 1, wherein the address of the at least one cell in the memory cell array comprises a column address and a row address.

5. A semiconductor memory device as recited in claim 1, wherein the control circuit is responsive to a control signal and comprises:
   a delay circuit that generates a delayed control signal in response to the control signal; and
   logic circuitry that generates the sample control signal in response to the control signal, the delayed control signal, and the at least a portion of the address of the at least one cell in the memory cell array.

6. A semiconductor memory device, comprising:
   a memory cell array comprising a plurality of memory cell array block sections;
   a plurality of sense amplifiers that generate output signals in response to a memory cell array address;
   a control circuit that generates a sample control signal in response to at least a portion of the memory cell array address and a control signal such that the sample control signal is delayed relative to the control signal based on the proximity of the memory cell array block section identified by the at least a portion of the memory cell array address to the plurality of sense amplifiers; and
   a plurality of data sampling circuits that sample the output signals of the sense amplifiers in response to the sample control signal.

7. A semiconductor memory device as recited in claim 6, wherein the delay of the sample control signal relative to the control signal is higher for the memory cell block sections that are further from the plurality of sense amplifiers than the delay of the sample control signal relative to the control signal is for the memory cell block sections that are closer to the plurality of sense amplifiers.

8. A semiconductor memory device as recited in claim 6, wherein there is no delay between the sample control signal and the control signal for the memory cell block section that is closest to the plurality of sense amplifiers.

9. A semiconductor memory device as recited in claim 6, wherein the memory cell array address comprises a column address.

10. A semiconductor memory device as recited in claim 6, wherein the memory cell array address comprises a row address.

11. A semiconductor memory device as recited in claim 6, wherein the memory cell array address comprises a column address and a row address.

12. A method of sampling data from an semiconductor memory device, comprising the steps of:
   providing a memory cell array;
   generating data output signals in response to a memory cell array address;
   sampling the data output signals in response to a sample control signal; and
   generating the sample control signal in response to at least a portion of the memory cell array address.

13. A method as recited in claim 12, wherein the memory cell array comprises a plurality of memory cell array block sections, and wherein the step of generating the sample control signal comprises the step of:
   generating the sample control signal in response to the at least a portion of the memory cell array address and a control signal, such that the sample control signal is delayed relative to the control signal based on the position of the memory cell array block section identified by the at least a portion of the memory cell array address in the memory cell array.

14. A method as recited in claim 12, wherein the memory cell array address comprises a column address.

15. A method as recited in claim 12, wherein the memory cell array address comprises a row address.

16. A method as recited in claim 12, wherein the memory cell array address comprises a column address and a row address.

17. A system for sampling data from an semiconductor memory device, comprising:
   a memory cell array;
   means for generating data output signals in response to a memory cell array address;
   means for sampling the data output signals in response to a sample control signal; and
   means for generating the sample control signal in response to at least a portion of the memory cell array address.

18. A system as recited in claim 17, wherein the memory cell array comprises a plurality of memory cell array block sections, and wherein the means for generating the sample control signal comprises:
   means for generating the sample control signal in response to the at least a portion of the memory cell array address and a control signal, such that the sample control signal is delayed relative to the control signal based on the position of the memory cell array block section identified by the at least a portion of the memory cell array address in the memory cell array.

19. A system as recited in claim 17, wherein the memory cell array address comprises a column address.

20. A system as recited in claim 17, wherein the memory cell array address comprises a row address.

21. A system as recited in claim 17, wherein the memory cell array address comprises a column address and a row address.

* * * * *